US011626163B2

(12) United States Patent
Bates et al.

(10) Patent No.: US 11,626,163 B2
(45) Date of Patent: Apr. 11, 2023

(54) PROGRAM VOLTAGE STEP BASED ON PROGRAM-SUSPEND TIME

(71) Applicant: Micron Technology, Inc., Boise, ID (US)

(72) Inventors: Justin Bates, Boise, ID (US); Giuseppe Cariello, Boise, ID (US); Pitamber Shukla, Boise, ID (US); Fulvio Rori, Boise, ID (US); Chiara Cerafogli, Boise, ID (US); Scott Anthony Stoller, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 36 days.

(21) Appl. No.: 17/464,853

(22) Filed: Sep. 2, 2021

(65) Prior Publication Data

US 2023/0067570 A1    Mar. 2, 2023

(51) Int. Cl.
| G06F 12/00 | (2006.01) |
| G11C 16/10 | (2006.01) |
| G11C 16/04 | (2006.01) |
| G06F 3/06 | (2006.01) |
| G11C 16/34 | (2006.01) |

(52) U.S. Cl.
CPC ............ G11C 16/10 (2013.01); G06F 3/0604 (2013.01); G06F 3/0659 (2013.01); G06F 3/0679 (2013.01); G11C 16/0483 (2013.01); G11C 16/3459 (2013.01)

(58) Field of Classification Search
CPC ................ G11C 16/10; G11C 16/0483; G11C 16/3459; G06F 3/0604; G06F 3/0659; G06F 3/0679
USPC ....................................................... 711/103
See application file for complete search history.

(56) References Cited

U.S. PATENT DOCUMENTS

| 5,937,424 A * | 8/1999 | Leak ...................... G11C 16/26 365/185.11 |
| 11,342,035 B1 * | 5/2022 | Pitner .................... G11C 16/30 |

* cited by examiner

*Primary Examiner* — Mardochee Chery
(74) *Attorney, Agent, or Firm* — Schwegman Lundberg & Woessner, P.A.

(57) ABSTRACT

Various embodiments provide for adjusting (or adapting) a program voltage step used to program a memory cell by a program algorithm after the program algorithm resumes from a suspension, where the program voltage step is adjusted (or adapted) based on one or more factors.

20 Claims, 7 Drawing Sheets

PROGRAM VOLTAGE STEP BASED ON PROGRAM-SUSPEND TIME

TECHNICAL FIELD

Embodiments of the disclosure relate generally to memory devices and, more specifically, to adjusting a program voltage step used to program a memory cell based on at least one of program-suspend time or a temperature associated with the memory cell, which can be performed by a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
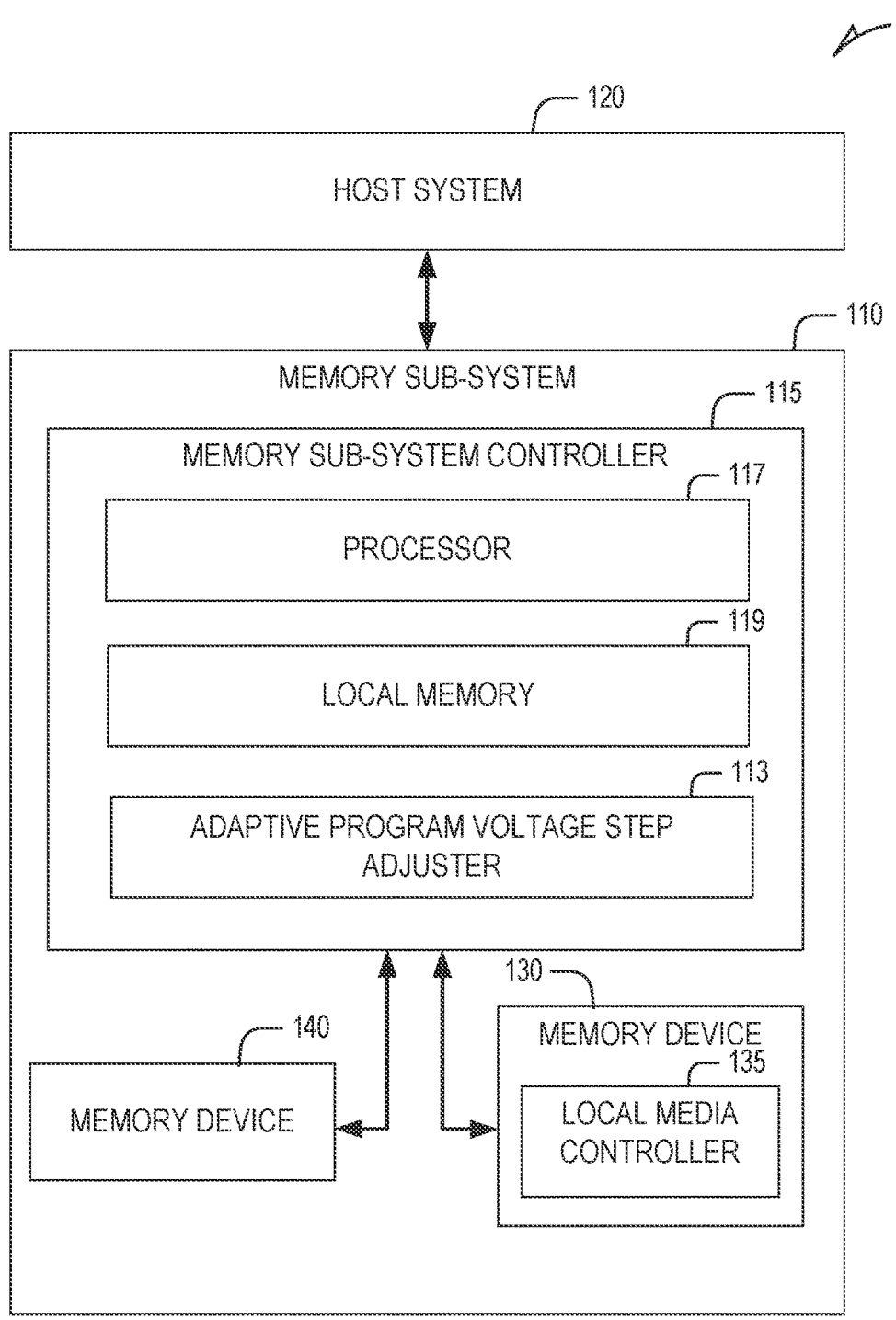
FIG. 1 is a block diagram illustrating an example computing system that includes a memory sub-system, in accordance with some embodiments of the present disclosure.

Aspects of the present disclosure are directed to adjusting (e.g., adapting) a program voltage step used to program a memory cell based on at least one of program-suspend time or a temperature associated with the memory cell, which can be performed by a memory sub-system. In particular, some embodiments described herein can adjust (or adapt) a program voltage step used to program a memory cell of a memory device by a program algorithm after the program algorithm resumes from a suspension, where the program voltage step is adjusted (or adapted) based on one or more factors, which can include program-suspend time and of a temperature associated with the memory cell (e.g., operating temperature of NAND memory cell). A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can send access requests to the memory sub-system, such as to store data at the memory sub-system and to read data from the memory sub-system.

The host system can send access requests (e.g., write command, read command) to the memory sub-system, such as to store data on a memory device at the memory sub-system, read data from the memory device on the memory sub-system, or write/read constructs (e.g., such as submission and completion queues) with respect to a memory device on the memory sub-system.

A memory device can be a non-volatile memory device. A non-volatile memory device is a package of one or more die. Each die can be comprised of one or more planes. For some types of non-volatile memory devices (e.g., negative-and (NAND)-type devices), each plane is comprised of a set of physical blocks. For some memory devices, blocks are the smallest area that can be erased. Each block is comprised of a set of pages. Each page is comprised of a set of memory cells, which store bits of data. The memory devices can be raw memory devices (e.g., NAND), which are managed externally, for example, by an external controller. The memory devices can be managed memory devices (e.g., managed NAND), which are a raw memory device combined with a local embedded controller for memory management within the same memory device package.

As noted herein, certain memory devices, such as NAND-type memory devices, comprise multiple blocks with each of those blocks comprising multiple pages (also referred as wordlines), where each page usually comprises multiple memory cells. A threshold voltage (VT) of a memory cell can be the voltage at which the floating gate (e.g., NAND transistor) implementing the memory cell turns on and conducts (e.g., to a bit line coupled to the memory cell). Generally, writing data to such memory devices involves programming (by way of a program operation) the memory devices at the page level of a block, and erasing data from such memory devices involves erasing the memory devices at the block level (i.e., page level erasure of data is not possible). In particular, using a program operation to program a page with data can comprise using a loop (hereafter, a program/verification loop) that comprises running a program algorithm and running a program verification (PV) algorithm, where the program algorithm causes one or more voltage pulses to be applied to the page to program the page with the data, and where the program verification algorithm checks the one or more cells of the page to verify whether the one or more cells have actually been programmed as intended. If the program verification passes, the program verification algorithm can inhibit the one or more cells from any further programming (e.g., can indicate that the one or more cells are in SSPC (Selective Slow Programming Convergence) region, and so a full program pulse should be avoided), and can render the one or more cells readable. If the program verification does not pass, the program algo performs one or more loops of applying an additional voltage pulse (e.g., at a voltage level higher than used by the program algorithm) to the one or more memory cells, followed by a verification of the one or more cells, where the loops are performed until the one or more cells complete programming and the verification passes. During the first iteration of the one or more loops performed by the program verification, the first additional voltage pulse applied to a memory cell is performed at a program voltage level. For each iteration that follows the first iteration, the additional voltage pulse is performed at a program voltage level that represents an increase of a program voltage increase (or step) over the prior pulse (performed during the preceding iteration).

To serve urgent requests (e.g., read requests), a program operation suspend command can be issued by a host system to a memory sub-system to cause the memory sub-system to stop a long (e.g., in the order of milliseconds) program operation. The latency of the program operation suspend can directly affect the read latency and the quality of service (QoS) of the memory device, memory subsystem, or memory system. Generally, the parameter of a NAND memory cell that describes a program operation suspend max latency is designated tPSPD, where tPSPD is a sum of two contributions: (1) the time the memory sub-system (e.g., firmware thereof) needs to get to a closest synch point; and (2) the time the memory sub-system needs to safely close the program algorithm and enter a suspend state. A synch point is a point during the program algorithm where a pending suspend request (e.g., asynchronously issued by the host system during execution of the program algorithm) can be acknowledged and serviced by the memory sub-system. To reduce the program operation suspend max latency, sync points are often placed as frequently as possible, including while a program verification is being performed. This means that a program/verification loop can be interrupted by a program suspend at any one of the synch points, and such an interruption can insert a consistent and unpredictable delay between two subphases —a first, pulse phase where a voltage pulse phase is applied at a program voltage level and a second, verification phase. On resuming the program algorithm after a program operation suspend, the program algorithm usually restarts with a program verification. In case of multiple program operation suspends, depending on the resume to suspend time (hereafter, designated as tRSPSPD), the program algorithm may or may not make forward progress. For instance, if tRSPSPD is longer than the program verification time (hereafter, designated tPVFY), the program algorithm can apply a voltage pulse before the next program operation suspend (thereby permitting more memory cells to reach their required voltage level), the program/verification loop count increases, and the program operation makes forward progress toward program completion. If tRSPSPD is shorter than tPVFY, the program algorithm can interrupt the program verification at a closer sync point and will not issue a voltage pulse, thereby resulting in the next program operation resume starting with the same program verification and no forward progress being made.

Unfortunately, due to program operation suspends, a program verification can be delayed, and this combined with CL experienced by memory cells (which causes the charge of certain NAND memory cells to lose charge over time (e.g., shift left on voltage graph)), some undesired effects can result. For example, a memory cell that was pushed into a SSPC region by a latest program voltage pulse (before a program operation suspend) will experience charge distribution fall off and, therefore, will receive a full voltage pulse upon a program operation resume, thereby resulting in a higher chance that the memory cell will be over-programmed. In another example a memory cell already in the SSPC region on the previous pulse, already receiving an SSPC voltage pulse (reduced programming pulse) might fall below the program verify level on the current loop as a result charge loss due to a long delay between a program suspend and resume. This example could result in the cell receiving a large voltage step increase on the current operation instead of being inhibited. Such effects can result in overprogramming of the cell and increase an upper tail of a program voltage distribution, and can cause higher bit-error rates (BER) for the memory cells, which affects read performance and reliability of those memory cells.

Aspects of the present disclosure address the above and other deficiencies by adjusting (or adapting) a program voltage step used on a memory cell by a program algorithm after the program algorithm resumes from a suspend, where the program voltage step is adjusted (or adapted) based on one or more factors, which can include: how long the program algorithm is suspended per single suspend (also referred to herein as program-suspend time, designated tSUSPEND); the number of suspend-resume cycles without making forward progress; a temperature associated with the memory cell (e.g., ambient temperature of the memory cell after suspension ends); and an initial voltage of the memory cell's threshold voltage. As described herein, a threshold voltage (VT) of a memory cell can be the voltage at which the floating gate (e.g., NAND transistor) implementing the memory cell turns on and conducts (e.g., to a bit line coupled to the memory cell). For some embodiments, one or more additional factors that contribute to CL of a memory cell can be considered in adjusting the program voltage step used after a program operation resume. According to some embodiments, during a program operation suspend, the number of reads requested (e.g., read requests sent by a host system) for a memory cell of a memory device is monitored (e.g., counted), and the resulting count serves as a proxy for determining the program-suspend time.

The adjusted (or adapted) program voltage step can represent an optimized program voltage step to be used upon a program operation resume. For some embodiments, the adjustment to the program voltage step is facilitated by way of a configurable voltage offset trim associated with a program operation resume (e.g., "resume_vpgm_offset" trim) for a memory device. For instance, to implement the adjusted program voltage step, an embodiment can adjust the configurable voltage offset trim that is applied to a program voltage step used by a program operation resume when the program operation resume applies a voltage pulse to a memory cell after a program operation suspension ends, where the program voltage step is one usually used by a program algorithm to program the memory cell. Additionally, for some embodiments, the adjusted program voltage step is used to program one or more memory cells of a memory device (e.g., NAND-type memory device) before or during a program operation resume. For instance, an embodiment can apply the adjusted program voltage step with respect to memory cells of the memory device by a command or request (e.g., set trim command to a NAND-type memory device) over a physical interface (or an Open NAND Flash Interface (ONFI)), or by requesting use of the adjusted program voltage step in a program operation resume request (or command) sent to the memory device (e.g., defining an address cycle in the program operation resume command). Depending on the embodiment, the amount of the adjustment to the program voltage step can depend, for example on a particular wordline or physical location in the array.

Unlike conventional methodologies that adjust the program voltage step down by a fixed amount (e.g., which can be defined to be conservative and cover worst case scenarios) after a program operation resume (and usually does it for only one pulse), the adjusted program voltage step provided by various embodiments and used after the program operation resume is adaptive (e.g., based on CL factors) and can be used for multiple voltage pulses after a program operation resume, which can reduce the overall number of program verification loops needed to complete a program operation of a memory cell when compared to conventional methodologies. For various embodiments, an adjusted program voltage step is applied (e.g., used) for a current loop (e.g., of a program algorithm) in which the program operation was suspended; a next loop can resume using a default/standard program voltage step unless there is another program operation suspend. The reduction in number of loops resulting from an embodiment can reduce or avoid negative effects on performances and latency with respect to the memory cell, and can reduce or avoid excessive or uneven wear on the memory cell, which can cause memory cell degradation and reliability risks for the memory cell. Additionally, the adaptively-adjusted program voltage step provided by various embodiments can reduce or avoid program disturb caused to neighboring memory cells.

As used herein, programming (e.g., performing a program operation on) a memory cell using a program voltage increase (or a program voltage step) can refer to programming (e.g., performing a program operation on) the memory cell using a voltage pulse at a program voltage level that is determined based on (e.g., increased by) the program voltage increase (or the program voltage step) from pulse-to-pulse. Generally, programming (e.g., performing a program operation on) a memory cell comprises applying (e.g., by using a program algorithm) a series of voltage pulses to the memory cell, with the voltage of the pulse increasing by the program voltage increase/step each subsequent voltage pulse (e.g., from voltage pulse-to-voltage pulse). For instance, where a program voltage step is 1 volt (1V) and a memory cell is programmed using a voltage pulse N at 18V, then a next voltage pulse N+1 used to program the memory cell would be at a voltage of 19V. Where an embodiment described herein adjusts (e.g., adapts or offsets) the program voltage step to be 0.5V (e.g., based on program operation suspension time, ambient temperature, etc.), the memory cell can be programmed using a voltage pulse N at 18V, and then programmed using a next voltage pulse N+1 at 18.5V.

Disclosed herein are some examples of adjusting a program voltage step used to program a memory cell (after a program operation resume) based on at least one of program-suspend time or a temperature associated with the memory cell, which can be performed by a memory sub-system as described herein.

FIG. 1 illustrates an example computing system 100 that includes a memory sub-system 110, in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, a secure digital (SD) card, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-systems 110. FIG. 1 illustrates one example of a host system 120 coupled to one memory sub-system 110. As used herein. "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., NVDIMM controller), and a storage protocol controller (e.g., a peripheral component interconnect express (PCIe) controller, serial advanced technology attachment (SATA) controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a SATA interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single-level cells (SLCs), can store one bit per cell. Other types of memory cells, such as multi-level cells (MLCs), TLCs, quad-level cells (QLCs), and penta-level cells (PLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

As used herein, a block comprising SLCs can be referred to as a SLC block, a block comprising MLCs can be referred to as a MLC block, a block comprising TLCs can be referred to as a TLC block, and a block comprising QLCs can be referred to as a QLC block.

Although non-volatile memory components such as NAND type flash memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide-based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide-based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or another suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, and so forth. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical memory address (e.g., physical block address) that are associated with the memory devices 130. The memory sub-system controller 115 can further include host interface circuitry to communicate with the host system 120 via the physical host interface. The host interface circuitry can convert the commands received from the host system 120 into command instructions to access the memory devices 130 and/or the memory device 140 as well as convert responses associated with the memory devices 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local media controller 135) for media management within the same memory device package. An example of a managed memory device is a managed NAND (MNAND) device.

The memory sub-system controller 115 includes an adaptive program voltage step adjuster 113 that implements adjusting a program voltage step used to program a memory cell of at least one of the memory devices 130, 140, after a program suspend, based on one or more factors, where the one or more facts can include program-suspend time and a temperature associated with the memory cell. According to some embodiments, the memory sub-system controller 115 receives, from the host system 120, a request to suspend a program operation of a set of memory cells of one of the memory devices 130, 140, where the program operation is being performed at a program voltage level (e.g., 12V) based on a predetermined program voltage step (e.g., standard or default program voltage step, such as 1V). In response to the request, the memory sub-system controller 115 causes suspension of the program operation of the set of memory cells.

For instance, the memory sub-system controller 115 can cause the program operation of the set of memory cells to be suspended at the next synch point. The adaptive program voltage step adjuster 113 can cause the memory sub-system controller 115 to monitor a time duration of that the program operation is suspended. According to some embodiments, the time duration is monitored using a timer (e.g., of the memory sub-system 110) to monitor the time duration between a start and an end of the suspension (e.g., program-suspend time). Alternatively, for some embodiments, the time duration is monitored by monitoring a number of reads requested (e.g., by the host system 120) for the set of memory cells during the suspension. For instance, the memory sub-system controller 115 can use a read counter (e.g., stored on the memory sub-system 110) that is updated based on the number of read requests received during the program operation suspension. For some embodiments, the number of reads (since the program operation suspension started) are used as a proxy for determining the time duration of the suspension (e.g., program-suspend time).

The adaptive program voltage step adjuster 113 can cause the memory sub-system controller 115 to detect when the suspension of the program operation ends (e.g., exits). After the suspension ends and prior to the program operation of the set of memory cells resuming, the adaptive program voltage step adjuster 113 can cause the memory sub-system controller 115 to determine (e.g., calculate) a voltage offset for the program voltage step based on at least one of the time duration or a temperature associated with the set of memory cells. For instance, where an embodiment that monitors the number of reads requested during the suspension, the voltage offset for the program voltage step is determined based on the number of reads requested. The adaptive program voltage step adjuster 113 can cause the memory sub-system controller 115 to determine the voltage offset for the program voltage step based on a temperature associated with the set of memory cells (e.g., ambient temperature of the memory device 130 or 140). The adaptive program voltage step adjuster 113 can cause the memory sub-system controller 115 to determine (e.g., sample or access data describing) the temperature associated with the set of memory cells after the suspension ends. Additionally, the adaptive program voltage step adjuster 113 can cause the memory sub-system controller 115 to determine the voltage offset for the program voltage step based on an initial voltage of a threshold voltage (VT) of the set of memory cells. For instance, the voltage offset can be determined by searching a voltage-offset lookup table based on the one or more factors being considered (e.g., number of reads requested, the temperature, the initial voltage of the threshold voltage of the set of memory cells, or some combination thereof). For some embodiments, the voltage-offset lookup table is stored on the memory sub-system 110. For example, the voltage-offset lookup table can be initially generated and stored on the memory sub-system 110 by a manufacturer of the memory sub-system 110. The voltage offset information populated in the voltage-offset lookup table can be generated based on testing or actual usage of the memory sub-system 110, or generate using a predetermined formula (e.g., formula based on program-suspend time and memory cell temperature).

Based on the voltage offset, the adaptive program voltage step adjuster 113 can cause the memory sub-system controller 115 to set the program voltage step to an adjusted program voltage step (e.g., 300 mV) for use after the program operation resumes. For instance, the adaptive program voltage step adjuster 113 can cause the memory sub-system controller 115 to set the program voltage step to the adjusted program voltage step by sending, to the memory device (e.g., 130, 140), a set trim command ( ) that instructs the memory device to use the adjusted program voltage step for the set of memory cells when the program operation resumes. Alternatively, where the memory sub-system controller 115 causes the program operation of the set of memory cells to resume by sending a request to resume to the memory device (e.g., 130, 140), the adaptive program voltage step adjuster 113 can cause the memory sub-system controller 115 to set the program voltage step to the adjusted program voltage step via the request (e.g., the request comprises an indication of the adjusted program voltage step to be used by the program operation resume).

The adaptive program voltage step adjuster 113 can cause the memory sub-system controller 115 to eventually cause the program operation to resume, where the program operation is configured to use the adjusted program voltage step after the program operation resumes. For instance, after the program operation resumes, the program operation can be configured to use the adjusted program voltage step by applying a voltage pulse (e.g., single voltage pulse), at a program voltage level determined based on the adjusted program voltage step (e.g., rather than the program voltage step), to the set of memory cells. After the voltage pulse is applied, a program verification can be performed on the set of memory cells.

Figure 2:
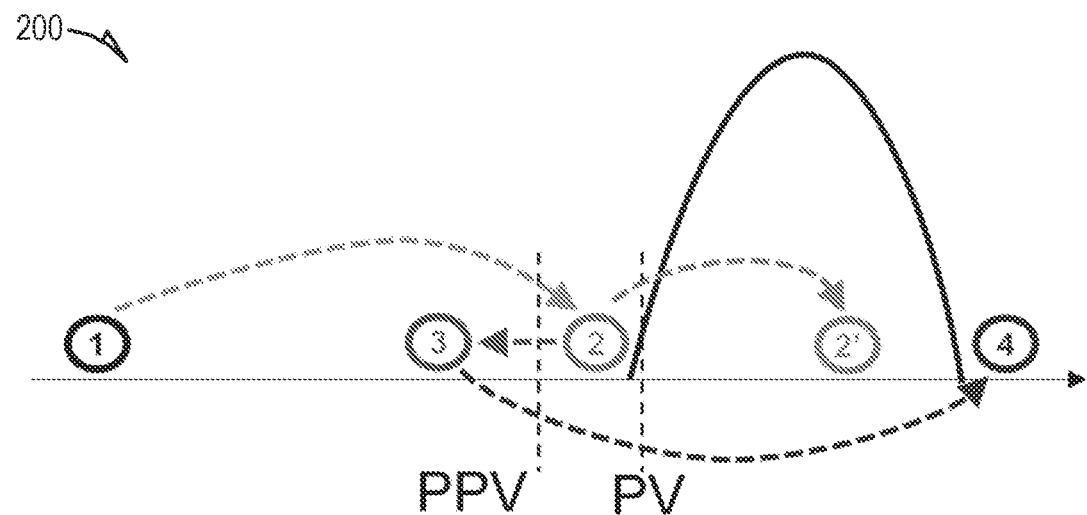
FIG. 2 are graphs that illustrate example overprogramming scenarios that can be avoided by some embodiments of the present disclosure.
Figure 2:
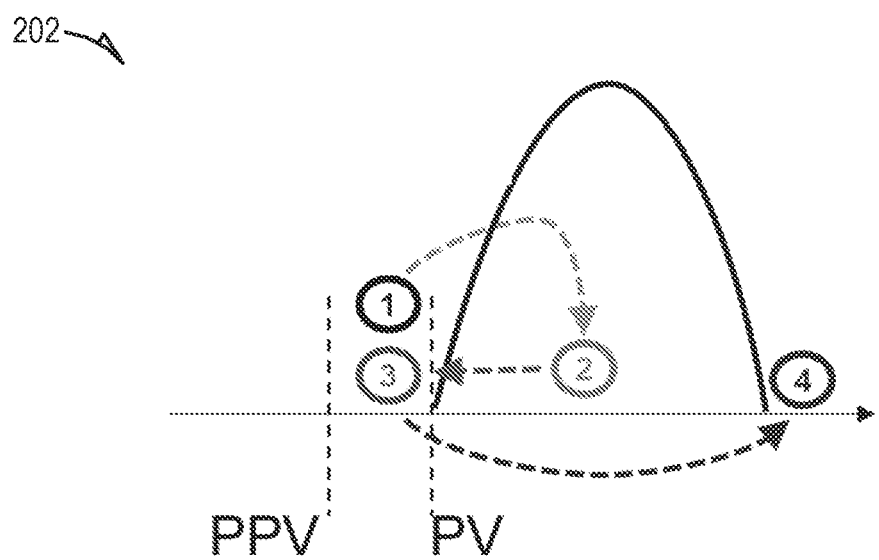

FIG. 2 are graphs 200, 202 that illustrate example over-programming scenarios that can be avoided by some embodiments of the present disclosure. In particular, graph 200 illustrates what would happen if a program operation suspend occurs prior to a program verification (PV) being performed, while graph 202 illustrates what would happen if a program operation suspend occurs while a program verification (PV) is performed but prior to the program verification completing. In another instance (not shown), the program operation suspend can occur after the program verification is complete, the SSPC information is discarded when the program operation is suspended, and when the program operation resumes, part of the program verification is performed again to recover the SSPC information. This can be very similar to the case where the PV is performed but prior to the program verification completing, a program operation suspend occurs.

Each of graph 200 and 202 illustrate a curve that represents a target program voltage distribution for a memory cell, where voltage within the curve represents that the programming of the memory cell is complete.

With reference to graph 200, voltage of the memory cell initially starts at position 1 and jumps from position 1 to position 2 after a voltage pulse at a program voltage level, determined based on a standard program voltage increase (or step), is applied to the memory cell. Position 2 can represent when SSPC is applied to the memory cell (illustrated by the region between prior to PV (PPV) and PV). While the memory cell voltage is at position 2 when the program verification step of the program algorithm is performed, the voltage of the memory cell would jump from position 2 to threshold voltage 2' during the next programming pulse, and the programming of the memory cell would be considered complete. However, if a program operation suspend occurs while the memory cell threshold voltage is at position 2 but prior to the program verification being performed, during the program suspend the voltage of the memory cell may lose charge and, as illustrated, the threshold voltage of the memory cell can move left (as illustrated by position 3). As a result, when the program operation eventually resumes, a voltage pulse at a program voltage level determined based on the standard program voltage step is applied (SSPC is not applied) to the memory cell, thereby causing the voltage of the memory cell to jump from position 3 to position 4 and to overshoot the target program voltage distribution of the memory cell. At position 4, the memory cell would be considered overprogrammed.

Referring now to graph 202, voltage of the memory cell initially starts at position 1, which can represent that the memory cell is already in SSPC. A program verification (PV) is performed, causing the voltage of the memory cell to jump from position 1 to position 2. Prior to the program verification completing (e.g., prior to the memory cell being inhibited by the PV), a program suspend operation occurs. During the program operation suspend the voltage of the memory cell loses charge (e.g., due to CL) and the voltage of the memory cell shifts left from position 2 to position 3. As a result, when the program operation eventually resumes, a voltage pulse at a program voltage level determined based on the standard program voltage step is applied to the memory cell, thereby causing the voltage of the memory cell to jump from position 3 to position 4 and to overshoot the target program voltage distribution of the memory cell. As previously noted, at position 4, the memory cell would be considered overprogrammed.

Various embodiments described herein adjust the program voltage step used by the program operation resume to prevent such the voltage overshooting illustrated by graphs 200 and 202.

Figure 3:
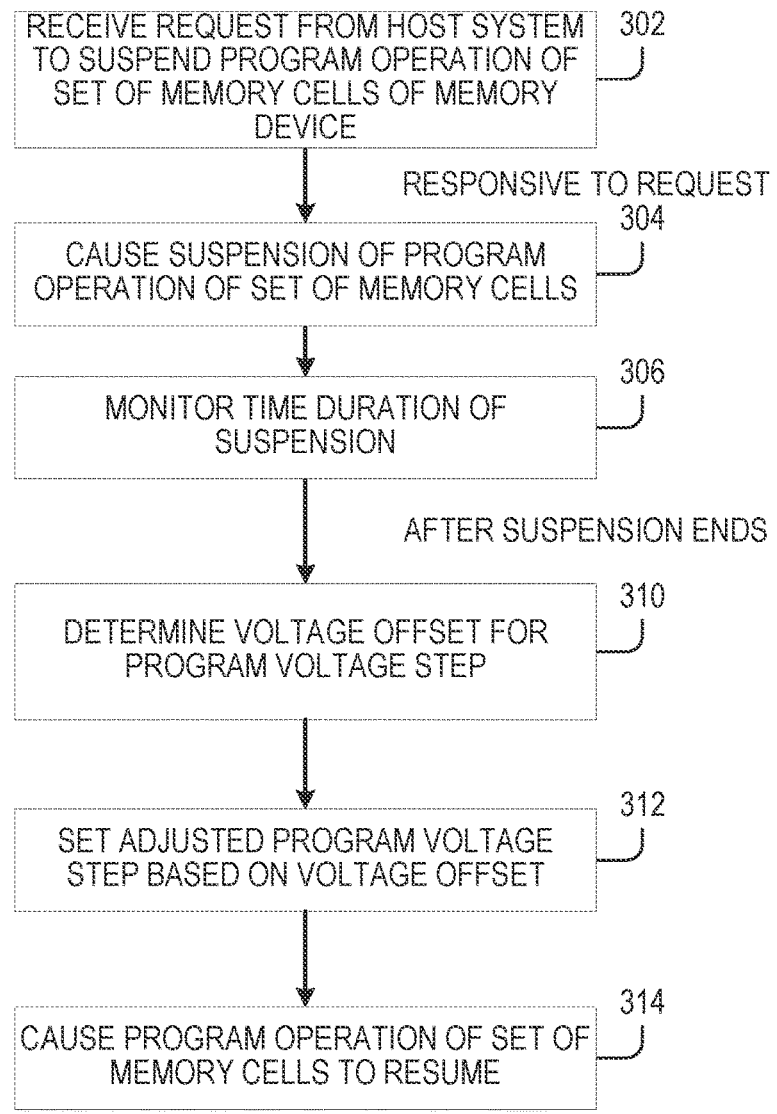
FIGS. 3 through 5 are flow diagrams of example methods for adjusting a program voltage increase (or step) used to program a memory cell after a program operation suspension, in accordance with some embodiments of the present disclosure.
Figure 4:
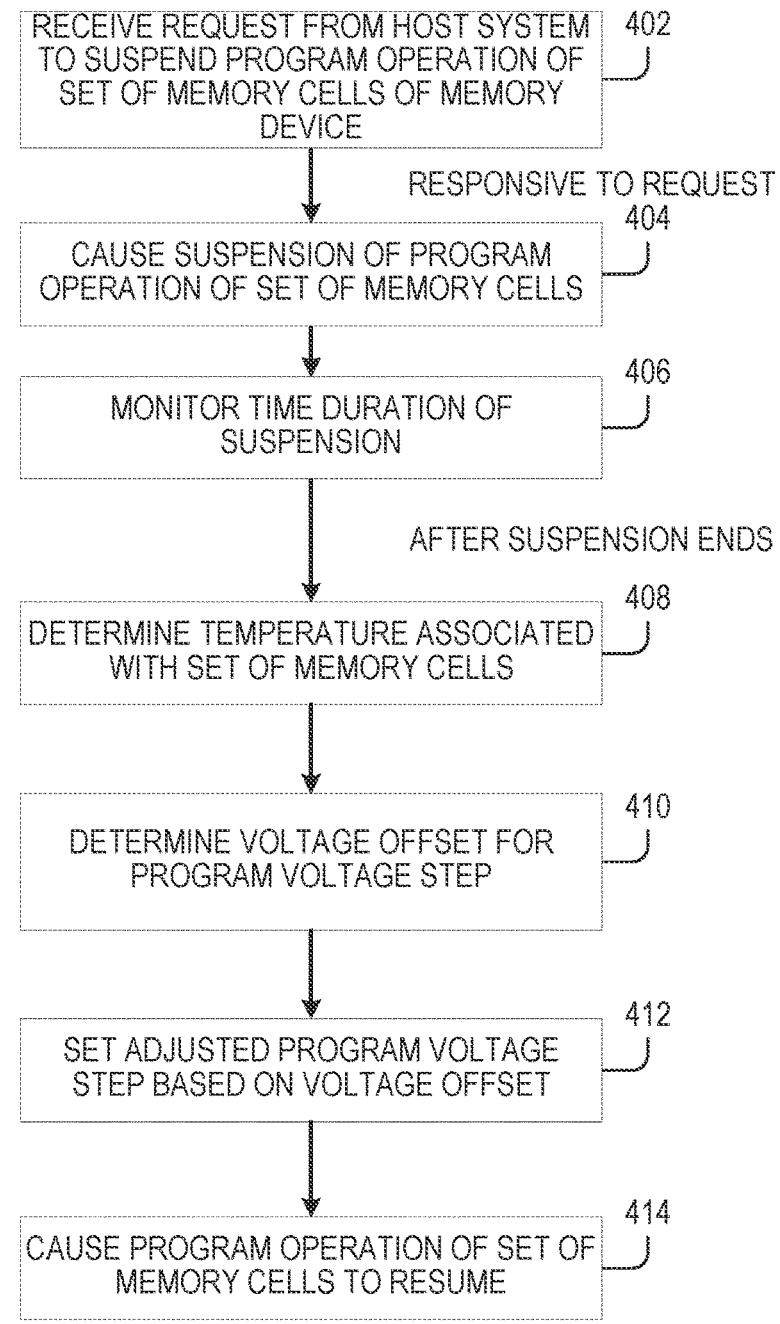
Figure 5:
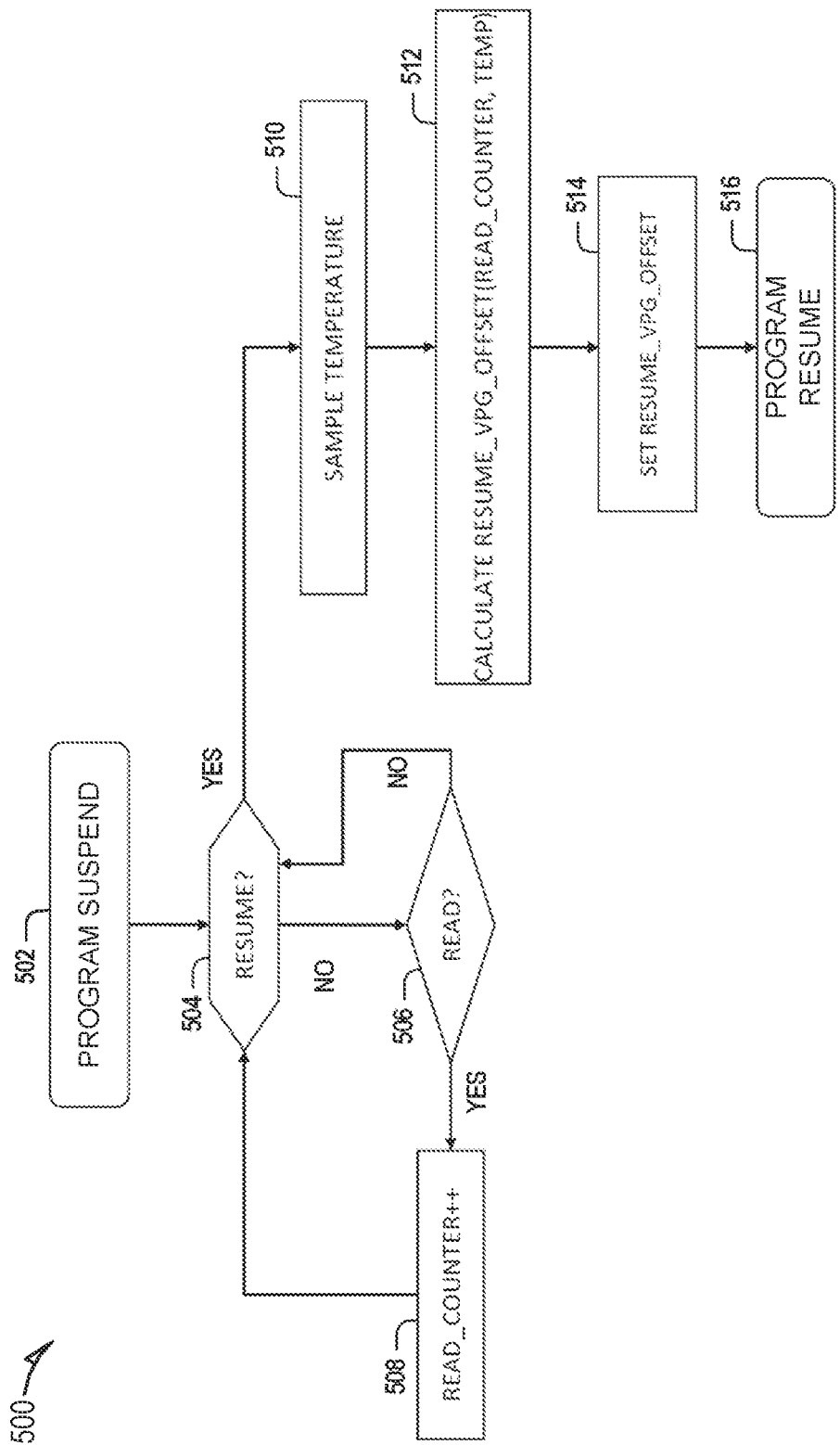

FIGS. 3 through 5 are flow diagrams of example methods for adjusting a program voltage increase (or step) applied to a memory cell after a program operation suspension, in accordance with some embodiments of the present disclosure. The methods 300, 400, 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, one or more operations of the methods 300, 400, or 500 are performed by the memory sub-system controller 115 of FIG. 1 based on the adaptive program voltage step adjuster 113. Additionally. or alternatively, for some embodiments, at least one of the methods 300, 400, 500 is performed, at least in part, by the local media controller 135 of the memory device 130 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are used in every embodiment. Other process flows are possible.

Referring now to the method 300 of FIG. 3, the method 300 is performed while a set of memory cells of a memory device (e.g., 130, 140) are being programmed (e.g., by the memory sub-system controller 115). The memory device can comprise a plurality of memory cells.

As illustrated, at operation 302, the processing device (e.g., the processor 117 of the memory sub-system controller 115) receives a request, from a host system (e.g., 120), to suspend a program operation of the set of memory cells of the memory device. As noted herein, the set of memory cells can be programmed by a program algorithm using a voltage pulse at a program voltage level determined based on a certain program voltage step (e.g., determined based on a standard or default program voltage step, such as 1V, being applied to an initial program voltage level, such as 18V).

In response to the request, at operation 304, the processing device (e.g., 117) causes (e.g., enables or otherwise facilitates) suspension of the program operation of (e.g., cause a program suspend for) the set of memory cells. For some embodiments, the program operation is being performed using a program voltage step (e.g., standard or default program voltage step), which can determine voltage pulse-to-voltage pulse increases during the program operation. During the suspension of the program operation, at operation 306, the processing device (e.g., 117) monitors a time duration of the suspension. For instance, operation 306 can use a timer of the memory sub-system (e.g., 110) to determine the time duration between a start and an end of the suspension. In another instance, operation 306 can comprise monitoring (e.g., using a counter) the number of reads requested for the set of memory cells, where the reads can be requested by the host system (e.g., 120). The processing device (e.g., 117) can continue monitoring the number of reads requested until the processing device detects that the suspension of the program operation has ended.

At operation 310, after the suspension ends and prior to the program operation of the set of memory cells resuming, the processing device (e.g., 117) determines (e.g., calculates) a voltage offset for the certain program voltage step based on one or more factors, which include the time duration monitored by operation 306 (e.g., as determined using a timer or by the number of reads requested and observed by the processing device during operation 306). Thereafter, at operation 312, the processing device (e.g., 117) sets the program voltage step to an adjusted program voltage step based on the voltage offset determined at operation 310, where the adjusted program voltage step is to be used for (e.g., to program) the set of memory cells after the program operation resumes.

Eventually, at operation 314, the processing device (e.g., 117) causes the program operation of the set of memory cells to resume. For various embodiments, the program operation of the set of memory cells (e.g., the program algorithm) can be configured to use the adjusted program voltage step after the program operation resumes. For instance, after the program operation resumes, a voltage pulse, at a program voltage level determined based on the adjusted program voltage step, can be applied to the set of memory cells, and the voltage pulse can be followed by a program verification being performed on the set of memory cells.

Referring now to the method 400 of FIG. 4, according to various embodiments, operations 402, 404, 406 are respectively similar to operation 302, 304, 306 of the method 300 of FIG. 3. At operation 408, after suspension of the program operation of the set of memory cells ends, the processing device (e.g., 117) determines a temperature associated with the set of memory cells. For example, the temperature can comprise the ambient temperature of the set of memory cells or the memory device (e.g., 130, 140) to which the set of memory cells belong. The processing device (e.g., 117) can sample (e.g., measure) the temperature or access data (e.g., generated by another function or service of the memory sub-system 110 and stored on the memory sub-system 110) that describes the current value of the temperature. Eventually, at operation 410, the processing device (e.g., 117) determines (e.g., calculates) a voltage offset for the certain program voltage step based on one or more factors, which include the time duration monitored by operation 406 (e.g., as determined using a timer or by the number of reads requested and observed by the processing device during operation 406) and the temperature determined at operation 408. For some embodiments, the one or more factors include an initial voltage of a threshold voltage of the set of memory cells. According to various embodiments, operations 412 and 414 are respectively similar to operations 312 and 314 of the method 300 of FIG. 3.

Referring now to the method 500 of FIG. 5, the method 500 illustrates an example implementation of the method 400 of FIG. 4. At operation 502, a set of memory cells of a memory device are in program operation suspend. During the program operation suspend, operations 504 through 514 can be performed. At operation 504, a determination is made on whether the program operation is to resume (e.g., via a program operation resume request). If the program operation is to resume, the method 500 continues to operation 510 and if not, the method 500 proceeds to operation 506.

Operation 506 detects for a read request (e.g., by the host system 120) for the set of memory cells. If no read request is detected, the method 500 returns to operation 504. If, however, a read request is detected by operation 506, the method 500 continues to operation 508, where a read counter (READ_COUNTER) is incremented by a value of one. After operation 508, the method 500 returns to operation 504.

Referring now to operation 510, a temperature (TEMP) (e.g., ambient temperature) associated with the set of memory cells is sampled. Subsequently, at operation 512, a program-operation-resume voltage offset (RESUME_VPG_OFFSET) is calculated based on the current of the read counter (READ_COUNTER) and the temperature sampled by operation 510. Then, at operation 514, the program-operation-resume voltage offset is set for the set of memory cells (e.g., via a MLBi command), thereby facilitating its use when the program operation eventually resumes. At operation 516, the program operation of the set of memory cells resumes. According to various embodiments, when the program operation resumes, the program operation applies a voltage pulse at a voltage based on the program-operation-resume voltage offset.

Figure 6:
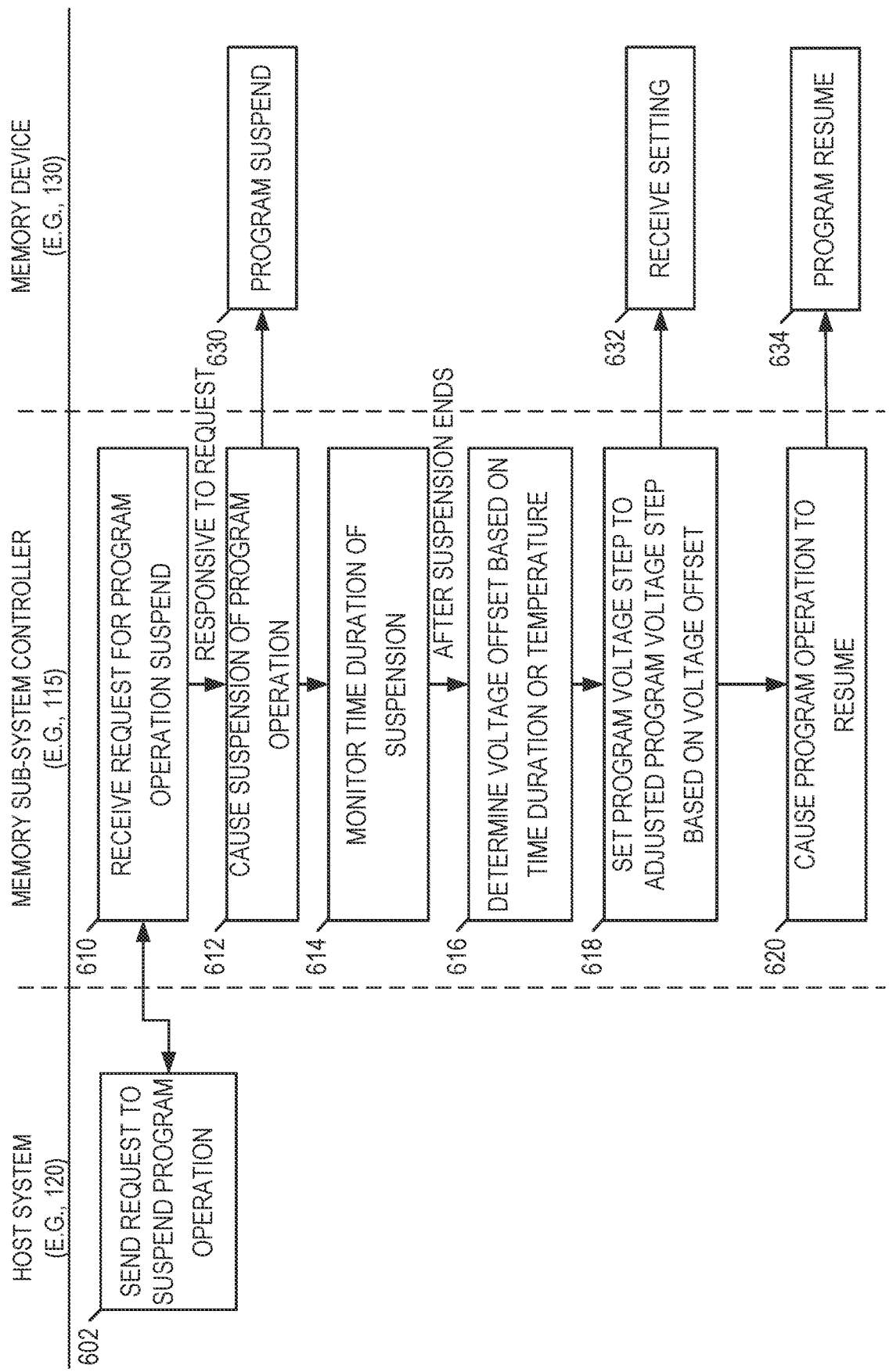
FIG. 6 provides an interaction diagram illustrating interactions between components of a computing environment in the context of some embodiments in which a method that adjusts a program voltage step used to program a memory cell as described herein is performed.

FIG. 6 provides an interaction diagram illustrating interactions between components of a computing environment in the context of some embodiments in which a method that adjusts a program voltage step used to program a memory cell as described herein is performed. The operations of the method can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method is performed by a host system (e.g., 120), a memory sub-system controller (e.g., 115), a memory device (e.g., 130 or 140), or some combination thereof. Although the operations are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are used in every embodiment. In the context of the example illustrated in FIG. 6, the host system can include the host system 120, the memory sub-system controller can include the memory sub-system controller 115, and the memory device can include the memory device 130.

As shown in FIG. 6, at operation 602, the host system 120 sends, to the memory sub-system 110, a request to suspend a program operation of a set of memory cells of the memory device 130. The host system 120 can send such a request so that, for example, the memory sub-system 110 can service one or more urgent read requests (from the host system 120) with respect to those set of memory cells.

At operation 610, the memory sub-system controller 115 receives the request to suspend the program operation and, in response, causes the program operation to suspend at operation 612 (e.g., sends a suspend request to the memory device 130). The memory device 130 facilitates program suspend at operation 630 (e.g., servicing the suspend request from the memory sub-system controller 115).

During the program operation suspension, at operation 614, the memory sub-system controller 115 monitors a time duration of the suspension (e.g., by monitoring a number of reads requested by the host system 120). After the suspension ends, at operation 616, the memory sub-system controller 115 determines a voltage offset based on at least one of the time duration monitored by operation 614 or a temperature associated with the set of memory cells. Thereafter, at operation 618, the memory sub-system controller 115 sets a program voltage step of the set of memory cells to an adjusted program voltage step based on the voltage offset determined at operation 616. The memory device 130 receives this setting at operation 632. Eventually, at operation 620, the memory sub-system controller 115 causes the program operation of the set of memory cells to resume. The memory device 130 facilitates the program resume at operation 634. According to various embodiments, during the program operation resume, the adjusted program voltage step used to program the set of memory cells and followed by a program verification.

Figure 7:
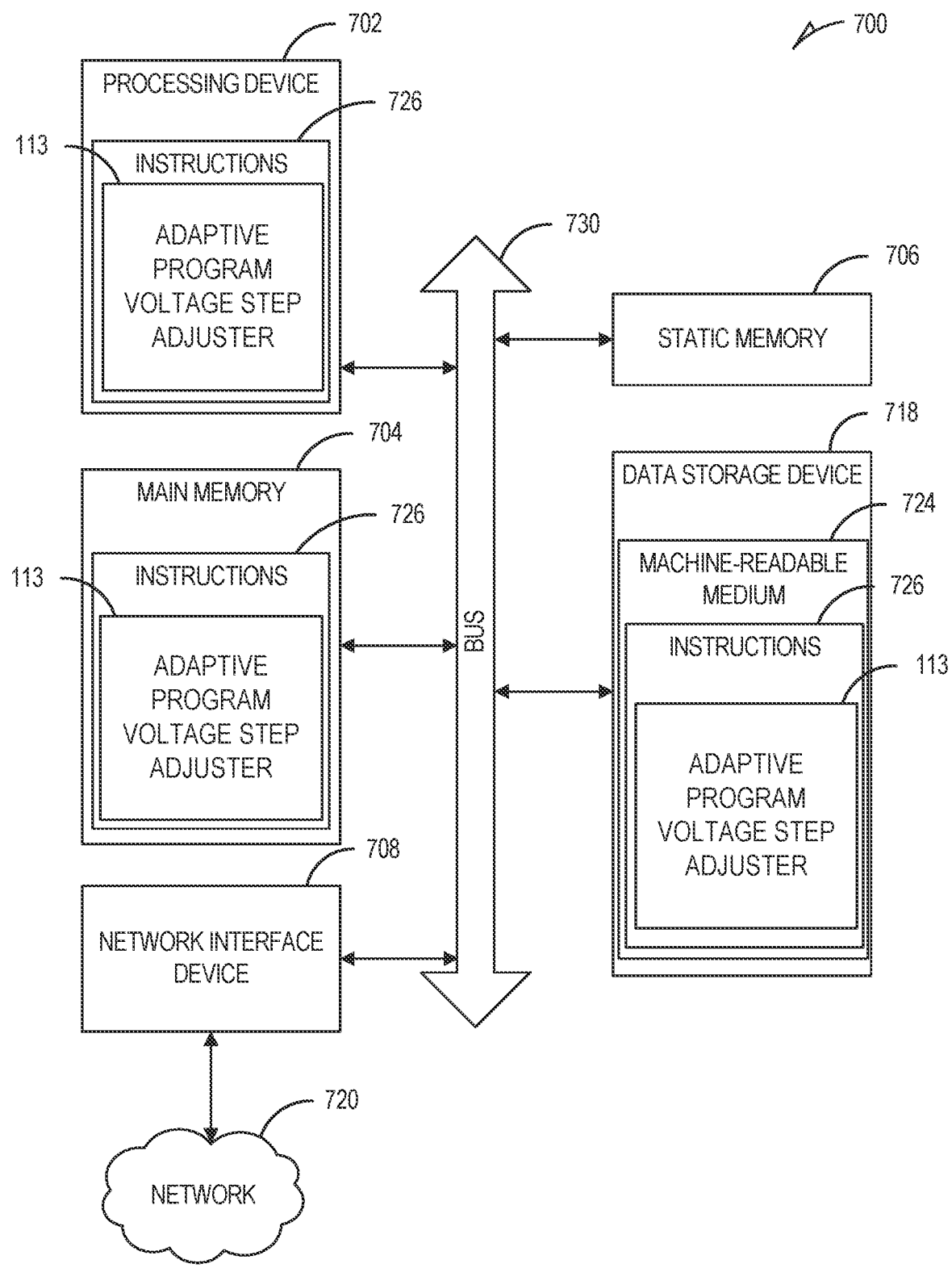
FIG. 7 is a block diagram of an example computer system in which embodiments of the present disclosure may operate.

FIG. 7 illustrates an example machine in the form of a computer system 700 within which a set of instructions can be executed for causing the machine to perform any one or more of the methodologies discussed herein. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations described herein. In alternative embodiments, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage device 718, which communicate with each other via a bus 730. Though both the main memory 704 and the data storage device 718 are illustrated as part of the computer system 700, it will be understood that the computer system 700 a computer system of an embodiment can include either the main memory 704, the data storage device 718, or both.

The processing device 702 represents one or more general-purpose processing devices such as a microprocessor, a central processing unit, or the like. More particularly, the processing device 702 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 702 can also be one or more special-purpose processing devices such as an application-specific integrated circuit (ASIC), a field programmable gate array (FPGA), a digital signal processor (DSP), a network processor, or the like. The processing device 702 is configured to execute instructions 726 for performing the operations and steps discussed herein. The computer system 700 can further include a network interface device 708 to communicate over a network 720.

The data storage device 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage device 718, and/or main memory 704 can correspond to the memory sub-system 110 of FIG. 1.

In one embodiment, the instructions 726 include instructions to implement functionality corresponding to adjusting a program voltage step used to program a memory cell after a program operation suspension as described herein (e.g., the adaptive program voltage step adjuster 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled to the memory device, configured to perform operations comprising:
receiving, from a host system, a request to suspend a program operation of a set of memory cells of the memory device, the program operation being performed using a program algorithm that applies to the set of memory cells a series of voltage pulses that are increased by a program step voltage each subsequent voltage pulse;

in response to the request, causing suspension of the program operation of the set of memory cells;

during the suspension of the program operation, monitoring a time duration of the suspension; and after the suspension ends and prior to the program operation of the set of memory cells resuming:
determining a voltage offset for the program voltage step based on the time duration of the suspension;
based on the voltage offset, setting the program voltage step to an adjusted program voltage step for use after the program operation resumes; and
causing the program operation to resume, the program operation being configured to use the adjusted program voltage step after the program operation resumes.

2. The system of claim 1, wherein the determining of the voltage offset is further based on a temperature associated with the set of memory cells.

3. The system of claim 2, wherein the operations comprise:
after the suspension ends and prior to the program operation of the set of memory cells resuming, determining the temperature.

4. The system of claim 1, wherein the determining of the voltage offset is further based on an initial voltage of a threshold voltage of the set of memory cells.

5. The system of claim 1, wherein the determining of the voltage offset based on the time duration comprises:
searching a voltage-offset lookup table based on the time duration.

6. The system of claim 5, wherein the voltage-offset lookup table is generated and stored on the system prior to the program operation of the set of memory cells.

7. The system of claim 1, wherein the program operation using the adjusted program voltage step after the program operation resumes comprises:
applying a voltage pulse, at a program voltage level determined based on the adjusted program voltage step, to the set of memory cells; and
performing a program verification on the set of memory cells after the applying of the voltage pulse.

8. The system of claim 1, wherein the adjusting of the program voltage step based on the voltage offset comprises:
sending, to the memory device, a set trim command that instructs the memory device to use the adjusted program voltage step for the set of memory cells when the program operation resumes.

9. The system of claim 1, wherein the causing of the program operation to resume comprises:
sending, to the memory device, a request to resume the program operation of the set of memory cells.

10. The system of claim 9, wherein the request comprises an indication of the adjusted program voltage step.

11. The system of claim 1, wherein the monitoring of the time duration of the suspension comprises monitoring a number of reads requested for the set of memory cells since the suspension started, and wherein the determining of the voltage offset for the program voltage step based on the number of reads requested.

12. The system of claim 1, wherein the monitoring of the time duration of the suspension comprises using a timer of the system to monitor the time duration between a start and an end of the suspension.

13. At least one non-transitory machine-readable storage medium comprising instructions that, when executed by a processing device, cause the processing device to perform operations comprising:
during suspension of a program operation of a set of memory cells of a memory device, monitoring a time duration of the suspension, the program operation being performed using a program algorithm that applies to the set of memory cells a series of voltage pulses that are increased by a program step voltage each subsequent voltage pulse; and
after the suspension ends and prior to the program operation of the set of memory cells resuming:
determining a voltage offset for the program voltage step based on the time duration of the suspension;
based on the voltage offset, setting the program voltage step to an adjusted program voltage step for use after the program operation resumes; and
causing the program operation to resume, the program operation being configured to use the adjusted program voltage step after the program operation resumes.

14. The at least one non-transitory machine-readable storage medium of claim 13, wherein the determining of the voltage offset is further based on a temperature associated with the set of memory cells.

15. The at least one non-transitory machine-readable storage medium of claim 13, wherein the determining of the voltage offset is further based on an initial voltage of a threshold voltage of the set of memory cells.

16. The at least one non-transitory machine-readable storage medium of claim 13, wherein the determining of the voltage offset based on the time duration comprises:
searching a voltage-offset lookup table based on the time duration.

17. The at least one non-transitory machine-readable storage medium of claim 13, wherein the program operation using the adjusted program voltage step after the program operation resumes comprises:
applying a voltage pulse, at a program voltage level determined based on the adjusted program voltage step, to the set of memory cells; and
performing a program verification on the set of memory cells after the applying of the voltage pulse.

18. The at least one non-transitory machine-readable storage medium of claim 13, wherein the monitoring of the time duration of the suspension comprises monitoring a number of reads requested for the set of memory cells since the suspension started, and wherein the determining of the voltage offset for the program voltage step based on the number of reads requested.

19. The at least one non-transitory machine-readable storage medium of claim 13, wherein the monitoring of the time duration of the suspension comprises using a timer to monitor the time duration between a start and an of the suspension.

20. A method comprising:
detecting, by a processing device, suspension of a program operation of a set of memory cells of a memory device, the program operation being performed using a program algorithm that applies to the set of memory cells a series of voltage pulses that are increased by a program step voltage each subsequent voltage pulse;
in response to detecting the suspension, monitoring, by the processing device, a time duration of the suspension; and after the suspension ends and prior to the program operation of the set of memory cells resuming:
  determining, by the processing device, a voltage offset for the program voltage step based on the time duration of the suspension;
  based on the voltage offset, setting, by the processing device, the program voltage step to an adjusted program voltage step for use after the program operation resumes; and
  causing, by the processing device, the program operation to resume, the program operation being configured to use the adjusted program voltage step after the program operation resumes.

* * * * *